United States Patent [19]

Tanaka et al.

[11] 4,297,645
[45] Oct. 27, 1981

[54] AUTOMATIC GAIN CONTROL CIRCUIT COMPRISING A CIRCUIT FOR COMPARING A MODULATED SIGNAL WITH AN ENVELOPE DETECTED SIGNAL

[75] Inventors: Kouichi Tanaka, Tokyo; Kiyoshi Amazawa, Ohmiya, both of Japan

[73] Assignees: Nippon Electric Co., Ltd.; Clarion Co., Ltd., both of Tokyo, Japan

[21] Appl. No.: 77,222

[22] Filed: Sep. 20, 1979

[51] Int. Cl.³ .............................................. H03G 3/30
[52] U.S. Cl. .................................... 330/280; 330/284
[58] Field of Search ............... 330/129, 134, 138, 145, 330/278, 279, 280, 284; 455/242, 243, 246, 249, 253

[56] References Cited

U.S. PATENT DOCUMENTS 3,879,672   4/1975   Milanes .......................... 330/129 X

*Primary Examiner*—James B. Mullins
*Attorney, Agent, or Firm*—Sughrue, Mion, Zinn, Macpeak and Seas

[57] ABSTRACT

For use in combination with a gain controllable amplifier for amplifying an input signal to produce an amplified signal with the gain controlled by a gain control signal, an automatic gain control circuit comprises a first section for shifting the level of the amplified signal by a first reference level and a second section for carrying out envelope detection of the amplified signal to produce an envelope detected signal of which the level is shifted by a second reference level different from the first reference level. A comparator compares the level-shifted signal with the envelope-detected signal to produce a pulse signal when the level of the latter signal traverses that of the former. The pulse signal is supplied to a smoothing circuit to produce a smoothed signal serving as the gain control signal.

5 Claims, 5 Drawing Figures ously large capacitance, for example, about 0.01 microfarad. The diode 26 is given a reference voltage derived by dividing the electric voltage $V_{cc}$ by a series connection of second and third resistors 27 and 28. The detected signal is converted into a signal of a direct current level by a plurality of resistors 32, 33, and 34 and a plurality of capacitors 36, 37, and 38. The last-mentioned signal is supplied to a transistor 39. The transistor 39 has an emitter-collector impedance variable in accordance with the direct current level. The gain control signal GC varies in response to variation of this impedance of the transistor 39. The level of the input signal IN is automatically controlled in accordance with the impedance. The automatic gain control of the amplifier 11 is thus accomplished by the use of the automatic gain control circuit 10.

AUTOMATIC GAIN CONTROL CIRCUIT COMPRISING A CIRCUIT FOR COMPARING A MODULATED SIGNAL WITH AN ENVELOPE DETECTED SIGNAL

BACKGROUND OF THE INVENTION

This invention relates to an automatic gain control circuit suitable for use in a radio receiver.

Generally, an automatic gain control circuit is coupled to an amplifier to automatically control the gain of the amplifier. It is preferred to manufacture such an automatic gain control circuit as a semiconductor integrated circuit. The automatic gain control circuit should have little temperature dependency. As will later be described with reference to one of a few figures of the accompanying drawing, a conventional automatic gain control circuit is not suitable for semiconductor integration because a capacitor is indispensible to couple the circuit to the amplifier. In addition, temperature dependency is serious. Moreover, a stabilized circuit should be coupled to the circuit and the amplifier to supply them with a stabilized voltage in case that an electric source voltage is liable to vary.

SUMMARY OF THE INVENTION

It is therefore an object of this invention to provide an automatic gain control circuit which is suitable for semiconductor integration.

It is another object of this invention to provide an automatic gain control circuit of the type described, which can be connected to a gain controllable amplifier without the use of a coupling capacitor.

It is still another object of this invention to provide an automatic gain control circuit of the type described, wherein temperature dependency is improved.

It is a further object of this invention to provide an automatic gain control circuit of the type described, which need not be accompanied by a stabilized circuit for a stabilized voltage.

An automatic gain control circuit to which this invention is applicable is to be coupled to an amplifier having a controllable gain and responsive to an input signal and a gain control signal for amplifying the input signal with the gain automatically controlled in compliance with the gain control signal to produce an amplified signal. The automatic gain control circuit is responsive to the amplified signal for producing the gain control signal. The automatic gain control circuit according to this invention comprises first means having a first refererence level and responsive to the amplified signal for superposing the amplified signal on the first reference level to produce a first signal of a first level variable in compliance with the amplified signal, second means having a second reference level and responsive to the amplified signal for carrying out envelope detection of the amplified signal to produce a second signal of a second level variable in response to the amplified signal with the second variable level offset by the second reference level so that the second variable level traverses the first variable level during discrete intervals of time, third means for comparing the first signal with the second signal to produce a pulse signal during the discrete intervals, and fourth means for smoothing the pulse signal to produce the gain control signal.

DESCRIPTION OF THE PREFERRED EMBODIMENTS

Figure 1:
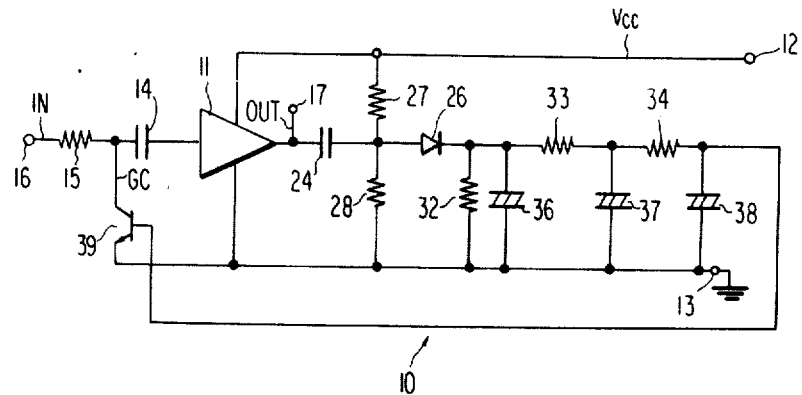
FIG. 1 is a circuit diagram of a conventional automatic gain control circuit and a gain controllable amplifier.

Referring to FIG. 1, description will be made of a conventional automatic gain control circuit 10 coupled to a gain controllable amplifier 11 in order to facilitate an understanding of this invention. The automatic gain control circuit 10 and the amplifier 11 are connected to first and second terminals 12 and 13 between which an electric voltage $V_{cc}$ of, for example, 13.2 V is impressed from an electric power source (not shown). The second source terminal 13 is grounded. The amplifier 11 is connected through an input capacitor 14 and an input resistor 15 to an input terminal 16 and is connected to an output terminal 17. Supplied with an input signal IN through the input terminal 16 and a gain control signal GC, the amplifier 11 amplifies the input signal IN with a gain automatically controlled in compliance with the gain control signal GC to deliver an amplified signal OUT to the output terminal 17. Typically, the input signal IN is of an intermediate frequency and is subjected to an amplitude modulation. The automatic gain control circuit 10 is connected to the output terminal 17 and a point of connection between the capacitor 14 and the resistor 15. The automatic gain control circuit 10 supplies the amplifier 11 with the gain control signal GC in response to the amplified signal OUT. More particularly, the automatic gain control circuit 10 comprises a coupling capacitor 24 for removing a direct current component accompanying the amplified signal OUT and a diode 26 for detecting the amplified signal OUT free from the direct current component to produce a detected signal. The capacitor 24 is of compara- The conventional automatic gain control circuit 10 should be provided with the coupling capacitor 24 of large capacitance. The diode 26 has a forward voltage variable in accordance with the temperature. Accordingly, the conventional circuit 10 is not suitable for semiconductor integration and temperature dependency is serious, as described in the preamble of the instant specification. In addition, the electric voltage $V_{cc}$ should be stabilized to keep the reference voltage of the diode 24 constant. This applies to another conventional gain control circuit having a transistor instead of the diode 26.

Figure 2:
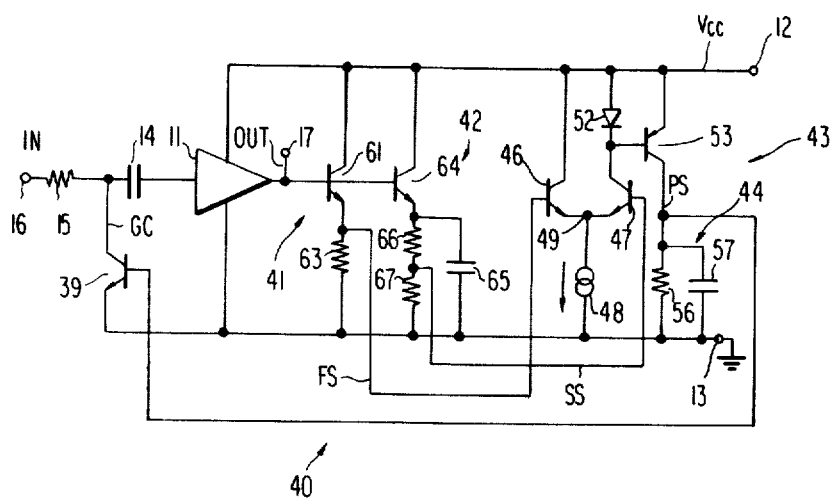
FIG. 2 shows a circuit diagram of an automatic gain control circuit according to an embodiment of this invention with a gain controllable amplifier coupled thereto.

Referring to FIG. 2, wherein similar parts are designated by like reference numerals as in FIG. 1, an automatic gain control circuit 40 according to a first embodiment of this invention is to be coupled to the amplifier 11. It is to be noted here that the amplifier 11 has an impedance (included in the amplifier 11) between the output terminal 17 and the second terminal 13. The amplified signal OUT is developed across the impedance with a direct current component accompanied therewith when the input signal IN is supplied to the amplifier 11.

Figure 3:
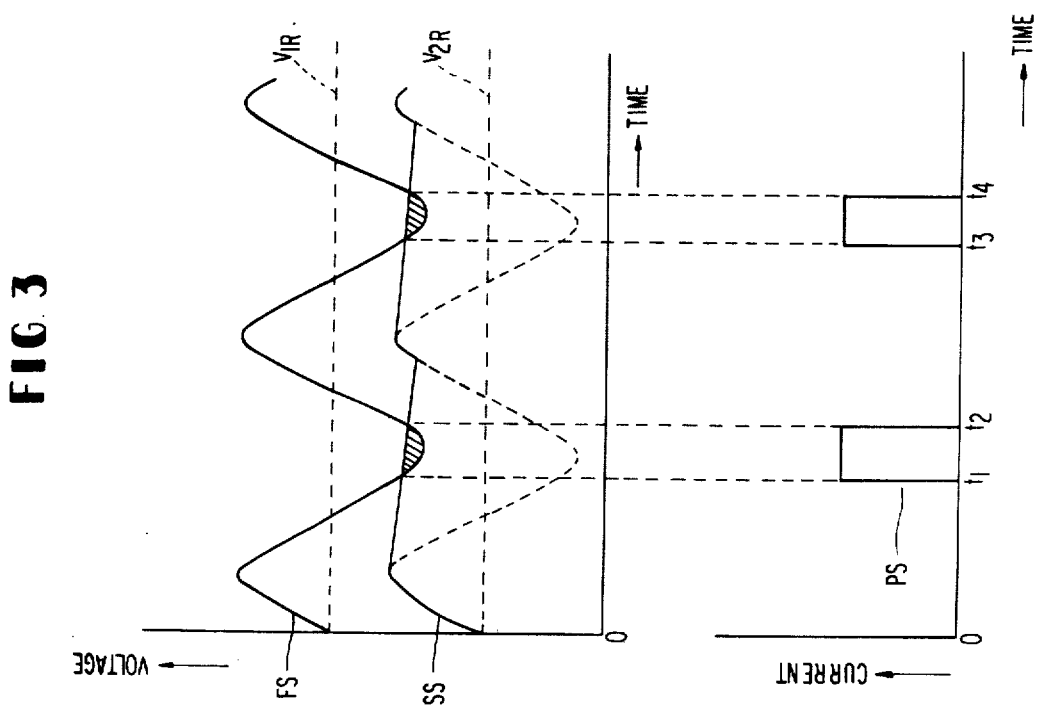
FIG. 3 shows wave forms for describing operation of the automatic gain control circuit illustrated in FIG. 2.

Referring to FIG. 3 together with FIG. 2, the gain control circuit 40 comprises first and second sections 41 and 42 connected direct to the output terminal 17 and connected between the first and second terminals 12 and 13. As will become clear as the description proceeds, the first section 41 has a first reference level $V_{1R}$ and the second section 42, a second reference level $V_{2R}$. The first reference level $V_{1R}$ is higher than the second reference level $V_{2R}$ in this embodiment. The first section 41 is for superposing the amplified signal OUT on the first reference level $V_{1R}$ to produce a first signal FS of a first level variable in compliance with the amplified signal OUT. The second section 42 is for carrying out envelope detection of the amplified signal OUT to produce a second signal SS of a second level variable in response to the amplified signal OUT. The second variable level is offset by the second reference level $V_{2R}$ relative to the first reference level $V_{1R}$. Practically, the first and second reference levels $V_{1R}$ and $V_{2R}$ has a difference $V_t$ of about 2 volts. Under these circumstances, the second variable level traverses or exceeds the first variable level during discrete intervals of time $t_1-t_2$ and $t_3-t_4$ indicated at the bottom of FIG. 3. The discrete intervals are rendered longer as the amplified signal OUT increases in amplitude.

The gain control circuit 40 further comprises a third section 43 for comparing the first signal FS with the second signal SS to produce a pulse signal PS during the discrete intervals. The pulse signal PS is supplied from the third section 43 to a fourth section 44 for smoothing the same. The third section 43 comprises a first transistor 46 of an NPN type having a base supplied with the first signal FS, an emitter, and a collector connected to the first terminal 12 and a second transistor 47 of an NPN type having a base supplied with the second signal SS, an emitter connected to the emitter of the first transistor 46, and a collector. The third section 43 further comprises a constant current circuit 48 between a point 49 of connection of the emitter of the first transistor 46 with the emitter of the second transistor 47 and the second terminal 13. The constant current circuit 48 causes a constant current $I_0$ to flow through the first transistor 46 during the time that the first variable level is higher than the second variable level. Connected between the collector of the second transistor 47 and the first terminal 12, a signal supplying circuit comprises a diode 52 between the collector of the second transistor 47 and the first terminal 12 and a third transistor 53 of a PNP type having a base connected to the collector of the second transistor 47, an emitter connected to the first terminal 12, and a collector connected to the fourth section 44. When the second variable level is higher than the first variable level, the third transistor 53 is rendered conductive. As a result, the constant current $I_0$ flows through the diode 52, the second transistor 47, and the constant current circuit 48 rather than through the first transistor 46 to supply the fourth section 44 with the pulse signal PS. The fourth section 44 comprises a parallel connection of a resistor 56 and a capacitor 57 between the collector of the third transistor 53 and the second terminal 13 to smooth or rectify the pulse signal PS and to deliver a smoothed signal to the transistor 39. The smoothed signal serves to vary the emitter-collector impedance of the transistor 39 as in the conventional circuit 10 described with reference to FIG. 1. The gain control signal GC varies in response to variation of this impedance.

Further referring to FIG. 2, the first section 41 comprises a transistor 61 of an NPN type having a base to be connected to the output terminal 17, an emitter connected to the base of the first transistor 46, and a collector connected to the first terminal 12. A resistor 63 is connected between the emitter of the transistor 61 and the second terminal 13. Specifically, resistance $R_0$ of the resistor 63 is about 8 kiloohms. The transistor 61 is kept conductive irrespective of presence and absence of the amplified signal OUT. The emitter of the transistor 61 is therefore given the first reference level $V_{1R}$ in the absence of the amplified signal OUT. The first section 41 acts as an emitter follower. In other words, the emitter of the first transistor 61 is supplied with the first signal FS into which the level of the amplified signal OUT is shifted by the first reference level $V_{1R}$. It is now understood that the emitter follower circuit serves to superpose the amplified signal OUT on the first reference level $V_{1R}$ and to produce the first signal FS.

The second section 42 comprises a transistor 64 of an NPN type having a base to be connected to the output terminal 17, an emitter, and a collector connected to the first terminal 12. A capacitor 65 is connected between the emitter of the transistor 64 and the second terminal 13. A series connection of first and second resistors 66 and 67 is connected between the emitter of the transistor 64 and the second terminal 13, with a point 68 of connection between the resistors 66 and 67 connected to the base of the second transistor 47. Specifically, the capacitor 65 is of 0.01 microfarad and the first and second resistors 66 and 67 have first and second resistances $R_1$ and $R_2$ of about 5 and 28 kiloohms, respectively. The transistor 64 is kept conductive irrespective of presence and absence of the amplified signal OUT. Inasmuch as the second reference level $V_{2R}$ is determined in the absence of the amplified signal OUT by the voltage drop across the second resistor 67, the second reference level $V_{2R}$ is lower than the first reference level $V_{1R}$. When the amplified signal OUT is supplied to the transistor 64, it is subjected to envelope detection by the second section 42 to develop, at the point 68 of connection, the second signal SS with the second variable level given by a sum of the second reference level $V_{2R}$ and a signal resulting from the envelope detection.

When the input signal IN supplied to the amplifier 11 is subjected to amplitude modulation with a carrier amplitude modulated by a modulating signal, the automatic gain control circuit 40 enables the amplitude modulated carrier and the modulating signal to be derived, as the first and the second signals FS and SS, from the emitter of the transistor 61 of the first section 41 and the emitter of the transistor 64 of the second section 42, respectively. Both of the derived carrier and the derived modulating signal are automatically gain controlled by the automatic gain control circuit 40.

It is unnecessary with the automatic gain control circuit 40 to use the coupling capacitor 24 illustrated in FIG. 1. This is because it is possible on designing the circuit 40 to reduce variations of emitter potentials of the transistors 61 and 64 to an extent of ±1 volt even when the source voltage $V_{cc}$ supplied between the first and second terminals 12 and 13 is variable.

Moreover, it is possible with the circuitry of the automatic gain control circuit 40 comprising the emitter resistor 63 of the first section 41 and the first and second resistors 66 and 67 of the second section 42 to reduce the adverse effects which would otherwise result from the variation of the source voltage $V_{cc}$ as will be described in the following. At first, the difference $V_t$ between the first and second reference levels $V_{1R}$ and $V_{2R}$ is given by:

$$V_t = V_{1R} - V_{2R} \quad (1)$$

as described above. For simplification of description, the resistance $R_0$ of the resistor 63 is assumed to be equal to the sum of the resistance $R_1$ of the first resistor 66 and the resistance $R_2$ of the second resistor 67. Under this assumption, Equation (1) is rewritten into:

$$V_t = V_{1R}[1 - R_2/(R_1 + R_2)] = V_{1R} \cdot R_1/(R_1 + R_2). \quad (2)$$

From Equation (2), a variation $\Delta V_t$ of the difference $V_t$ is given by:

$$\Delta V_t = \Delta V_{1R} \cdot R_1/(R_1 + R_2), \quad (3)$$

where $\Delta V_{1R}$ represents a variation of the first reference level $V_{1R}$. Usually, the factor $R_1/(R_1 + R_2)$ in Equation (3) is less than one-sixth or so. Therefore, the variation $\Delta V_t$ is negligible. In fact, Equation (3) approximately holds even when the resistance $R_o$ is different from the sum of the resistance $R_1$ and $R_2$ because the variation $\Delta V_{1R}$ of the first reference level $V_{1R}$ is considerably small. Furthermore, the difference $V_t$ is substantially invariable because of the differential connection of the first and second transistors 46 and 47. These are the reasons why the coupling capacitor 24 is unnecessasry.

Figure 4:
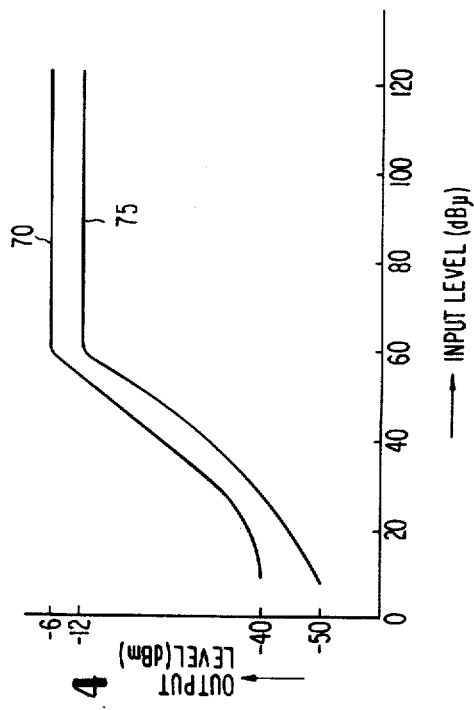
FIG. 4 is a graphical representation of input versus output characteristics of the automatic gain control circuit depicted in FIG. 2.

Referring to FIG. 4, wherein the abscissa and ordinate represent an input level of the input signal IN in dBμ and an output level of each of the first and second signals FS and SS in dBm, respectively, the automatic gain control circuit 40 according to the embodiment of this invention is specified by input versus output characteristics illustrated by first and second curves 70 and 75 for the first and second signals FS and SS, respectively. It is clear from the curves 70 and 75 that the output levels of the first and second signals FS and SS are kept constant after the input level reaches a predetermined level of, for example, about 60 dBμ. In the example illustrated in FIG. 4, use has been made of the input signal IN of the modulation factor of 80% which includes the carrier of 455 kHz and the modulating signal of 1 kHz.

Figure 5:
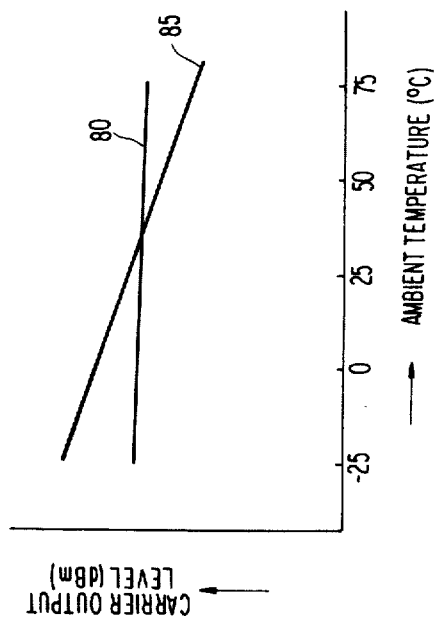
FIG. 5 is a graph of temperature characteristics of the automatic gain control circuit shown in FIG. 2 and of the conventional automatic gain control circuit illustrated in FIG. 1.

Referring to FIG. 5, the automatic gain control circuit according to the embodiment of this invention has a temperature characteristic illustrated by a curve 80 while the conventional circuit illustrated in FIG. 1 has a temperature characteristic illustrated by another curve 85. In FIG. 5, the abscissa and ordinate represent the ambient temperature and the output level of the first signal FS or of the carrier appearing at the emitter of the transistor 61, respectively. The curve 80 is substantially flat over a wide temperature range while the curve 85 is downwardly inclined as the temperature rises. From this fact, it is readily understood that the circuit according to the embodiment of this invention has little temperature dependency.

While this invention has so far been described in conjunction with one preferred embodiment, it is readily possible for those skilled in the art to put the invention into practice in various manners. For example, the transistors 46, 47, 61, and 64 may be of a PNP type and the transistor 53, of an NPN type. In this case, the first terminal 12 should be given a negative voltage. The first reference level $V_{1R}$ is lower than the second reference level $V_{2R}$.

What is claimed is:

1. An automatic gain control circuit to be coupled to an amplifier having a controllable gain and responsive to an input signal and a gain control signal for amplifying said input signal with the gain automatically controlled in compliance with said gain control signal to produce an amplified signal, said automatic gain control circuit being responsive to said amplified signal for producing said gain control signal, wherein the improvement comprises:

first means having a first reference level and responsive to said amplified signal for superposing said amplified signal on said first reference level to produce a first signal of a first level variable in compliance with said amplified signal;

second means having a second reference level and responsive to said amplified signal for carrying out envelope detection of said amplified signal to produce a second signal of a second level variable in response to said amplified signal with said second variable level offset by said second reference level so that said second variable level traverses said first variable level during discrete intervals of time;

third means for comparing said first signal with said second signal to produce a pulse signal during said discrete intervals; and fourth means for smoothing said pulse signal to produce said gain control signal.

2. An automatic gain control circuit as claimed in claim 1, said first reference level being higher than said second reference level, said control circuit having first and second terminals between which a power supply voltage is supplied, wherein said third means comprises:

a first transistor of an NPN type having a base supplied with said first signal, an emitter, and a collector connected to said first terminal;

a second transistor of an NPN type having a base supplied with said second signal, an emitter connected to the emitter of said first transistor, and a collector;

a constant current circuit between a point of connection of the emitter of said first transistor with the emitter of said second transistor and said second terminal for making a first current flow through said first transistor when said first variable level is higher than said second variable level; and signal supply means between the collector of said second transistor and said first terminal for causing a second current to flow through said second transistor and said constant current circuit when said second variable level is higher than said first variable level, said signal supply means thereby producing said pulse signal, said second current being substantially equal to said first current.

3. An automatic gain control circuit as claimed in claim 2, wherein said signal supplying means comprises:
   a diode between said first terminal and the collector of said second transistor; and
   a third transistor of a PNP type having an emitter connected to said first terminal, a base connected to the collector of said second transistor, and a collector connected to said fourth means.

4. An automatic gain control circuit as claimed in claims 2 or 3, said gain controllable amplifier comprising an impedance between said first and second terminals, said amplified signal being developed across said impedance when said input signal is supplied to said amplifier, wherein said first means comprises:
   a transistor of an NPN type having a base to be connected to said ouptut impedance, an emitter connected to the base of said first transistor, and a collector connected to said first terminal; and
   a resistor between the emitter of the transistor of said first means and said second terminal;
   the transistor of said first means being rendered conductive irrespective of presence and absence of said amplified signal so as to give said first reference level across said resistor in the absence of said amplified signal.

5. An automatic gain control circuit as claimed in claim 4, wherein said second means comprises:
   a transistor of an NPN type having a base to be connected to said impedance, an emitter, and a collector connected to said first terminal;
   a capacitor between the emitter of the transistor of said second means and said second terminal; and
   a series connection of a first and a second resistor between the emitter of the transistor of said second means and said second terminal with a point of connection of said first and said second resistors connected to the base of said second transistor;
   the transistor of said second means being rendered conductive irrespective of presence and absence of said amplified signal so as to give said second reference level across said second resistor in the absence of said amplified signal.

* * * * *